(12) United States Patent
Lin et al.

(10) Patent No.: US 12,009,275 B2
(45) Date of Patent: Jun. 11, 2024

(54) HEAT TRANSFER DEVICE

(71) Applicant: ASUSTeK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 93 days.

(21) Appl. No.: 17/381,259

(22) Filed: Jul. 21, 2021

(65) Prior Publication Data

US 2022/0026164 A1 Jan. 27, 2022

(30) Foreign Application Priority Data

Jul. 27, 2020 (TW) .................................. 109209609

(51) Int. Cl.
*H01L 23/367* (2006.01)
*F28D 21/00* (2006.01)
*H05K 7/20* (2006.01)
*F28D 9/00* (2006.01)

(52) U.S. Cl.
CPC ..... *H01L 23/3672* (2013.01); *H05K 7/20454* (2013.01); *F28D 9/0062* (2013.01); *F28D 2021/0029* (2013.01); *F28F 2255/02* (2013.01); *F28F 2280/10* (2013.01)

(58) Field of Classification Search
CPC ............. H01L 23/3672; H01L 23/3735; H01L 23/4332; F28F 2255/02; F28F 21/065; F28F 2013/006; F28F 21/02; F28F 2013/005; B32B 3/10; B32B 3/14; B32B 3/16; B32B 3/263; F28D 15/0241

USPC .......................................................... 165/46
See application file for complete search history.

(56) References Cited

U.S. PATENT DOCUMENTS

| | | | | |
|---|---|---|---|---|
| 4,379,376 | A * | 4/1983 | Adell ................... | B60R 13/043 |
| | | | | 52/716.5 |
| 5,618,601 | A * | 4/1997 | Ruby .................. | B32B 3/10 |
| | | | | 428/167 |
| 5,769,158 | A * | 6/1998 | Yao .................... | F28F 13/00 |
| | | | | 165/905 |
| 6,257,328 | B1 * | 7/2001 | Fujiwara ........... | H01L 23/4006 |
| | | | | 165/185 |
| 6,259,602 | B1 * | 7/2001 | Malhammar ........ | H01L 23/433 |
| | | | | 257/E23.09 |

(Continued)

FOREIGN PATENT DOCUMENTS

| | | |
|---|---|---|
| CN | 108135115 A | 6/2018 |
| CN | 207651473 U | 7/2018 |
| TW | M348901 U | 1/2009 |

*Primary Examiner* — Jianying C Atkisson
*Assistant Examiner* — For K Ling
(74) *Attorney, Agent, or Firm* — McClure, Qualey & Rodack, LLP

(57) ABSTRACT

A heat transfer device is provided. The heat transfer device includes a first heat conduction sheet and a second heat conduction sheet. The first heat conduction sheet includes two first rigid parts and a first bendable part connected between the two first rigid parts. The second heat conduction sheet includes two second rigid parts and a second bendable part connected between the two second rigid parts. The two first rigid parts are thermally coupled to the two second rigid parts, respectively. The first bendable portion includes a nonlinear section.

12 Claims, 6 Drawing Sheets

(56) References Cited

U.S. PATENT DOCUMENTS

| | | | | |
|---|---|---|---|---|
| 7,550,189 B1* | 6/2009 | McKnight | ................. | B64C 3/26 |
| | | | | 148/563 |
| 8,069,907 B2* | 12/2011 | Bryant | ................... | G06F 1/203 |
| | | | | 361/679.52 |
| 9,939,672 B2* | 4/2018 | Kakuda | ............. | G02F 1/133385 |
| 10,088,879 B2* | 10/2018 | Jin | ......................... | G06F 1/203 |
| 2003/0121643 A1* | 7/2003 | Connors | ............ | H01L 23/3675 |
| | | | | 257/E23.103 |
| 2005/0097937 A1* | 5/2005 | Durney | .................... | E04C 2/08 |
| | | | | 72/324 |
| 2010/0064695 A1* | 3/2010 | Wilcoxon | ............ | F04B 19/006 |
| | | | | 62/3.2 |
| 2015/0211815 A1* | 7/2015 | Sauer | .................... | F28F 21/065 |
| | | | | 165/185 |
| 2019/0124791 A1* | 4/2019 | Hsiao | ................. | H05K 7/20336 |
| 2019/0204017 A1* | 7/2019 | Kiso | .................. | F28D 15/0266 |

* cited by examiner

HEAT TRANSFER DEVICE

CROSS-REFERENCE TO RELATED APPLICATION

This application claims the priority benefit of Taiwan application serial No. 109209609, filed on Jul. 27, 2020. The entirety of the above-mentioned patent application is hereby incorporated by reference herein and made a part of specification.

BACKGROUND OF THE INVENTION

Field of the Invention

The disclosure relates to a heat transfer device and, more particularly, to a bendable heat transfer device.

Description of the Related Art

Heat sinks are widely used at various electronic devices to dissipate heat from heat-generating components (for example, integrated circuit components such as various processors/controllers). Most radiators such as fins, heat pipes, and vapor chambers have similar appearances and configurations. The appearance of heat dissipation devices/structures of other types such as water cooling devices and metal pivot structures can be changed by demand. However, they are larger in size and are not suitable for small electronic devices.

Another heat conduction solution with a single metal sheet cannot meet a heat conduction effect and a bending ability in consideration simultaneously. In detail, a thicker metal sheet has better heat conduction effect, but is not easy to be bended to a certain configuration. Conversely, a thinner metal sheet is easy to bend, but has a poor heat conduction effect.

With the launch of foldable electronic devices, a heat transfer device of a small size and good thermal conductivity is needed.

BRIEF SUMMARY OF THE INVENTION

According to the first aspect, a heat transfer device is provided. The heat transfer device comprises: a first heat conduction sheet including two first rigid parts and a first bendable part, the first bendable part is connected between the two first rigid parts; and a second heat conduction sheet including two second rigid parts and a second bendable part, the second bendable part is connected between the two second rigid parts; wherein the two first rigid parts of the first heat conduction sheet are thermally coupled to the two second rigid parts of the second heat conduction sheet, and the first bendable part includes a first nonlinear section.

The heat transfer device in this disclosure includes two heat conduction sheets stacked and fixedly connected to each other. A middle sections of the two heat conduction sheets includes a bendable portion, respectively. The bendable portion of one of the heat conduction sheets include a nonlinear section. Thus, the bendable portion of this heat conduction sheet is longer than the bendable portion of the other heat conduction sheet. Consequently, the heat transfer device of the above-mentioned structure has a good thermal conductivity and is easy to bend.

These and other features, aspects and advantages of the present invention will become better understood with regard to the following description, appended claims, and accompanying drawings.

DETAILED DESCRIPTION OF THE EMBODIMENTS

Figure 1:
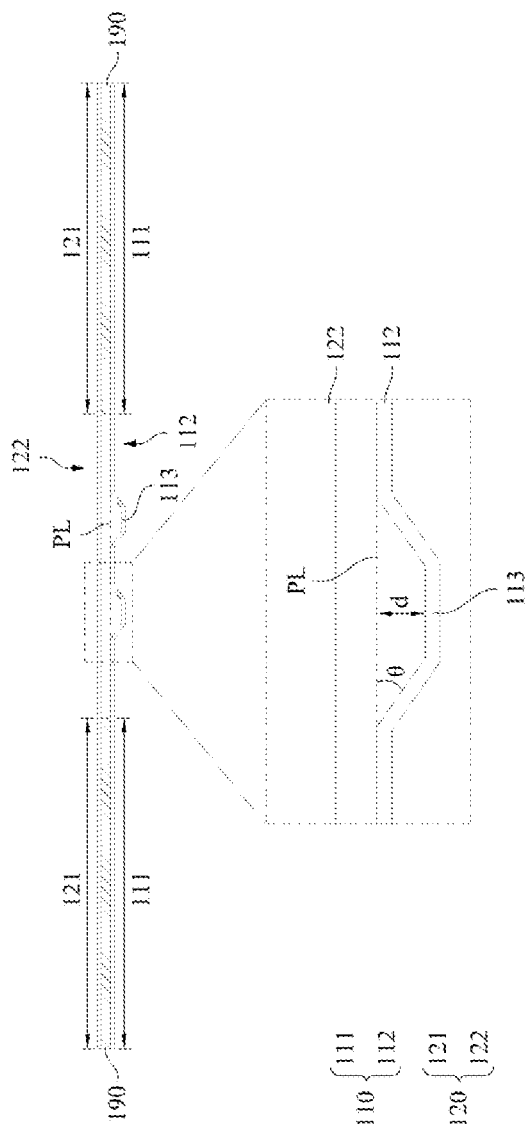
FIG. 1 is a side view of a heat transfer device at an unfolded state according to an embodiment of the disclosure.
Figure 2:
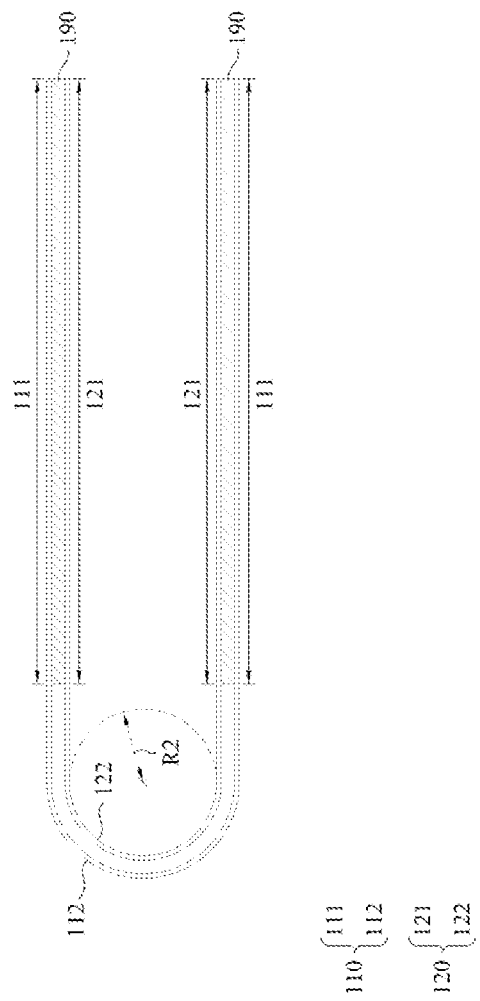
FIG. 2 is a side view of a heat transfer device at a bending state according to an embodiment of the disclosure.

As shown in FIG. 1 and FIG. 2, a heat transfer device 100 is a bendable heat transfer plate. In detail, the heat transfer device 100 has an unfolded state (as shown in FIG. 1) and a bending state (as shown in FIG. 2). As a result, the heat transfer device 100 is adapted to foldable electronic devices (such as foldable phones). The heat generated from one portion is guided to the other portion of the foldable electronic device, and then the area for heat dissipation is increased.

As shown in FIG. 1 and FIG. 2, the heat transfer device 100 includes a first heat conduction sheet 110 and a second heat conduction sheet 120 which are stacked and fixedly connected to each other. The first heat conduction sheet 110 includes two first rigid parts 111 and a first bendable part 112. The first bendable part 112 is connected between the two first rigid parts 111. The second heat conduction sheet 120 includes two second rigid parts 121 and a second bendable part 122. The second bendable part 122 is connected between the two second rigid parts 121.

The two first rigid parts 111 of the first heat conduction sheet 110 is fixedly connected to the two second rigid parts 121 of the second heat conduction sheet 120, respectively. In an embodiment, the first heat conduction sheet 110 and the second heat conduction sheet 120 are an integrally formed metal sheets (such as copper foil or aluminum foil), respectively.

As shown in FIG. 1 and FIG. 2, in an embodiment, the two first rigid parts 111 of the first heat conduction sheet 110 are thermally coupled to the two second rigid parts 121 of the second heat conduction sheet 120, respectively. The heat transfer device 100 further includes a thermal conductor 190. The thermal conductor 190 is fixedly connected between the first rigid part 111 and the second rigid part 121. Two opposite sides of the thermal conductor 190 contacts with the first rigid part 111 and the second rigid part 121, respectively. In other words, the first rigid part 111 is thermally coupled to the second rigid part 121 via the thermal conductor 190. The first rigid part 111 does not directly contact the second rigid part 121. In an embodiment, the thermal conductor 190 includes thermal glue or solder paste. In an embodiment, the first rigid part 111 and the second rigid part 121 are soldered together.

When the heat transfer device 100 is at the unfolded state as shown in FIG. 1, the second bendable part 122 is straightly connected between the two second rigid parts 121. The first bendable part 112 includes at least a first nonlinear section 113. Thus, the first bendable part 112 is longer than the second bendable part 122. The second heat conduction sheet 120 is regarded as an inner side, and the first heat conduction sheet 110 is regarded as an outer side when the heat transfer device 100 is bent. When the heat transfer device 100 is at the bending state as shown in FIG. 2, undulation of the first nonlinear section 113 disappears (or not easily seen), and the first bendable part 112 located at the outer side is bent smoothly to form a longer arc.

When the heat transfer device 100 is at the bending state as shown in FIG. 2, the first bendable part 112 and the second bendable part 122 have elastic deformation. Consequently, when the heat transfer device 100 is unfolded, the first bendable part 112 and the second bendable part 122 easily restore to the shape as shown in FIG. 1.

In the embodiment, the heat transfer device 100 includes two heat conduction sheets (such as the first heat conduction sheet 110 and the second heat conduction sheet 120) stacked to form a thick structure and have a better heat dissipate effect. In addition, the two heat conduction sheets include a bendable portion in the middle, respectively. The bendable portion of one of the heat conduction sheets includes a nonlinear section (such as the first nonlinear section 113 of the first heat conduction sheet 110) to compensate the arc length difference between the inner side and the outer side of the heat conduction sheet. Thus, the heat transfer device 100 is easily to be bent.

In an embodiment, when the heat transfer device 100 is at the unfolded state as shown in FIG. 1, the second heat conduction sheet 120 is straightly extended, and the two first rigid parts 111 of the first heat conduction sheet 110 are at the reference plane PL. Two ends of the first heat conduction sheet 110 are aligned to two ends of the second heat conduction sheet 120. In other words, the width of the first heat conduction sheet 110 is equal to that of the second heat conduction sheet 120. The first nonlinear section 113 of the first bendable part 112 is detached from the reference plane PL. That is, the first nonlinear section 113 is not located at the reference plane PL. Thus, the first heat conduction sheet 110 is longer than the second heat conduction sheet 120.

As shown in FIG. 1 and FIG. 2, in an embodiment, the first nonlinear section 113 includes a ladder structure. In an embodiment, the maximum bending angle is 180 degrees (that is, the bending state as shown in FIG. 2). To make the heat transfer device 100 bend 180 by degrees smoothly, the minimum length difference ΔL between the first heat conduction sheet 110 and the second heat conduction sheet 120 is π times a total thickness t of the second thermal conductive sheet 120 and the thermal conductor 190.

In sum, when the ladder structure has the height d, a hypotenuse of the ladder structure has an inclination angle θ. An isosceles trapezoid is taken as an example. The lengthening amount ΔTL provided by the first nonlinear section 113 of the single the ladder structure is as follows:

$$\Delta TL = \frac{2d}{\sin\theta}(1 - \cos\theta)$$

In detail, the height d is the distance between the ladder structure and the reference plane PL. The inclination angle θ is the angle between the hypotenuse of the ladder structure and the reference plane PL.

Therefore, when the ladder structure of the above size is configured, the number N of the ladder structure of the first bendable part 112 is at least the length difference ΔL divided by the lengthening amount ΔTL.

$$N \geq \frac{\Delta L}{\Delta TL} = \frac{\pi t \sin\theta}{2d(1 - \cos\theta)}$$

In practical applications, in an embodiment, when the heat transfer device 100 is bent, the first nonlinear section 113 is not fully extended. Furthermore, the first nonlinear section 113 has manufacturing tolerances. Therefore, in an embodiment, the number N of the ladder structure is greater than the length difference ΔL divided by the lengthening amount ΔTL.

In an embodiment, both the thickness of the first heat conduction sheet 110 and the thickness of the second heat conduction sheet 120 are not over 0.5 mm. In an embodiment, the radius of rotation R2 of the second heat conduction sheet 120 is greater than 5 mm.

In the embodiment, the first nonlinear section 113 shown in FIG. 1 and FIG. 2 has the ladder structure, which is not limited herein. In an embodiment, the first nonlinear section 113 is a circular arc structure, a triangular structure, or any combination of the structures with suitable appearance, which is not limited herein.

Figure 3:
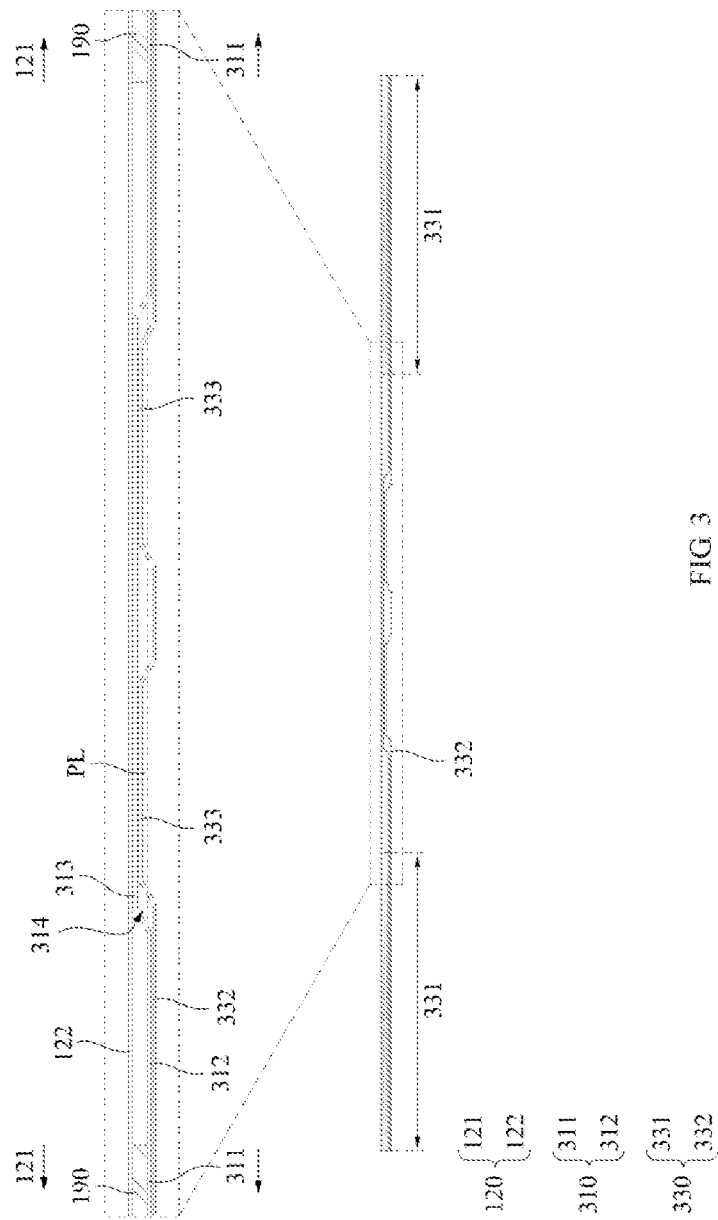
FIG. 3 is a side view of a heat transfer device at an unfolded state according to an embodiment of the disclosure.
Figure 4:
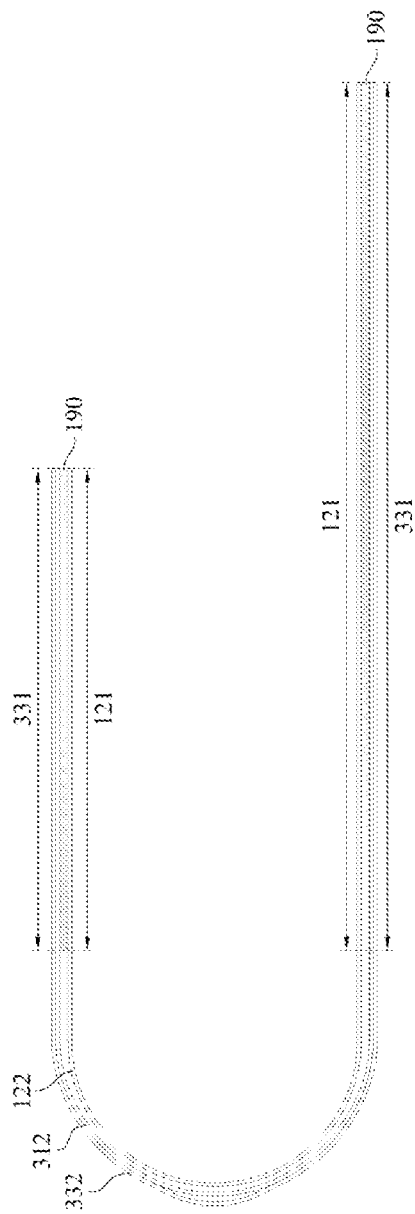
FIG. 4 is a side view of the heat transfer device in FIG. 3 at the bending state.

Please refer to FIG. 3 and FIG. 4. Different from the embodiment shown in FIG. 1 and FIG. 2, in this embodiment, when the heat transfer device 300 is at the unfolded state, the first nonlinear section 313 of the first bendable part 312 facing the second heat conduction sheet 120 is recessed. Therefore, the maximum thickness of the heat transfer device 300 at the unfolded state is reduced. In an embodiment, the first nonlinear section 313 extends to form a recess 314. The recess 314 faces away from the second heat conduction sheet 120.

In an embodiment, when the heat transfer device 300 is at the unfolded state shown in FIG. 3, the two first rigid parts 311 of the first heat conduction sheet 310 are located on the reference plane PL, and the first nonlinear section 313 is located between the reference plane PL and the second heat conduction sheet 120. In an embodiment, the first nonlinear section 313 is separated from the second heat conduction sheet 120. In other words, the first nonlinear section 313 does not contact the second heat conduction sheet 120. Then, the nonlinear section 313 and the second heat conduction sheet 120 does not rub against each other when the heat transfer device 300 is bent.

As shown in FIG. 3 and FIG. 4, compared with the embodiment shown in FIG. 1 and FIG. 2, in this embodiment, the heat transfer device 300 further includes the third heat conduction sheet 330. The third heat conduction sheet 330 is stacked under the first heat conduction sheet 310. Two ends of the third heat conduction sheet 330 are aligned to the two ends of the first heat conduction sheet 310. The third heat conduction sheet 330 includes two third rigid parts 331 and a third bendable part 332. The third bendable part 332 is connected between the two third rigid parts 331. The first heat conduction sheet 310 is located between the second heat conduction sheet 120 and the third heat conduction sheet 330. The two first rigid parts 311 are fixedly connected and thermally coupled to the two the third rigid parts 331, respectively.

The third bendable part 332 includes at least one third nonlinear section 333. When the heat transfer device 300 is at the unfolded state shown in FIG. 3, the third nonlinear section 333 is recessed towards the first heat conduction sheet 310 and is located in the recess 314. In the embodiment, when the heat transfer device 300 is at the bending state, the third heat conduction sheet 330 is located on an outermost side. Thus, the length of the third bendable part 332 must be greater than that of the first bendable part 312. Therefore, in an embodiment, the number of the third nonlinear section 333 is greater than that of the first nonlinear section 313 to increase the length of the third bendable part 332.

As shown in FIG. 3 and FIG. 4, in an embodiment, the first bendable part 312 includes the ladder structure (that is, the first nonlinear section 313). The third bendable part 332 includes a plurality of ladder structures (that is, the third nonlinear sections 333). The maximum width of the ladder structure of the third bendable part 332 is smaller than the maximum width of the ladder structure of the first bendable part 312. The ladder structure of the third bendable part 332 is accommodated in the ladder structure of the first bendable part 312.

As shown in FIG. 3 and FIG. 4, in an embodiment, the first rigid part 311 and the third rigid part 331 are soldered together. In the embodiment, the maximum bending angle of 180 degrees is taken as an example (that is, the bending state shown in FIG. 4), the length difference between the third heat conduction sheet 330 and the first heat conduction sheet 310 is at least $\pi$ multiply by the thickness of the first heat conduction sheet 310.

When the heat transfer device 300 is at the bending state (as shown in FIG. 4), the first bendable part 312 and the third bendable part 332 are not limited to be bent into an arc shape. In an embodiment, the third bendable part 332 has a longer reserved length (that is, the total length of all the ladder structures of the third bendable part 332 exceeds the minimum length difference between the third heat conduction sheet 330 and the first heat conduction sheet 310). Therefore, when the heat transfer device 300 is at the bending state, the third bendable part 332 is slightly convex (for example, a convex part corresponds to two third nonlinear sections 333 of the third bendable part 332). The third bendable part 332 is not bent into a semi-circle shape.

Figure 5:
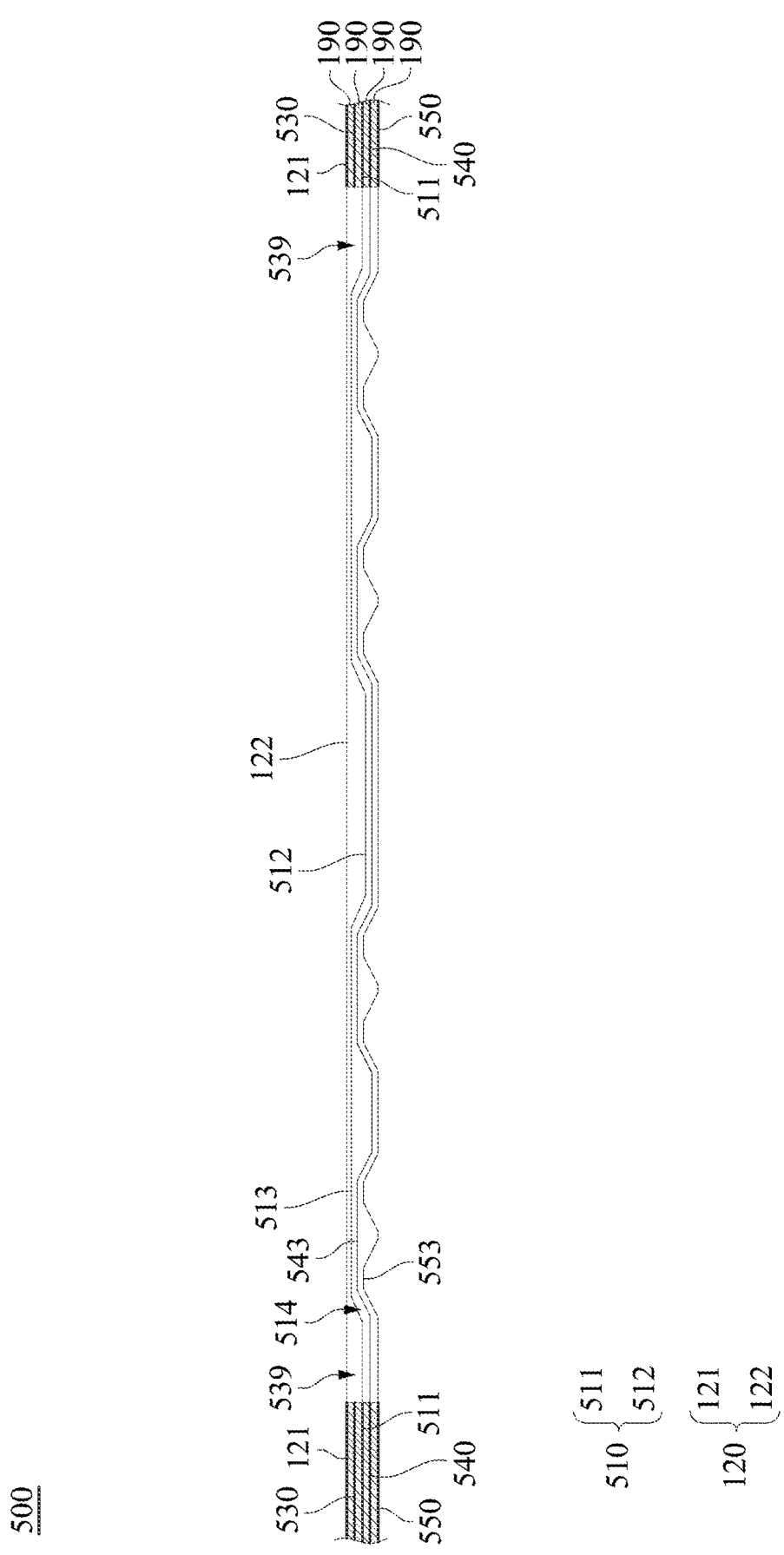
FIG. 5 is an enlarged view of part of a heat transfer device at an unfolded state according to an embodiment of the disclosure, all heat conduction sheets are indicated by single lines.
Figure 6:
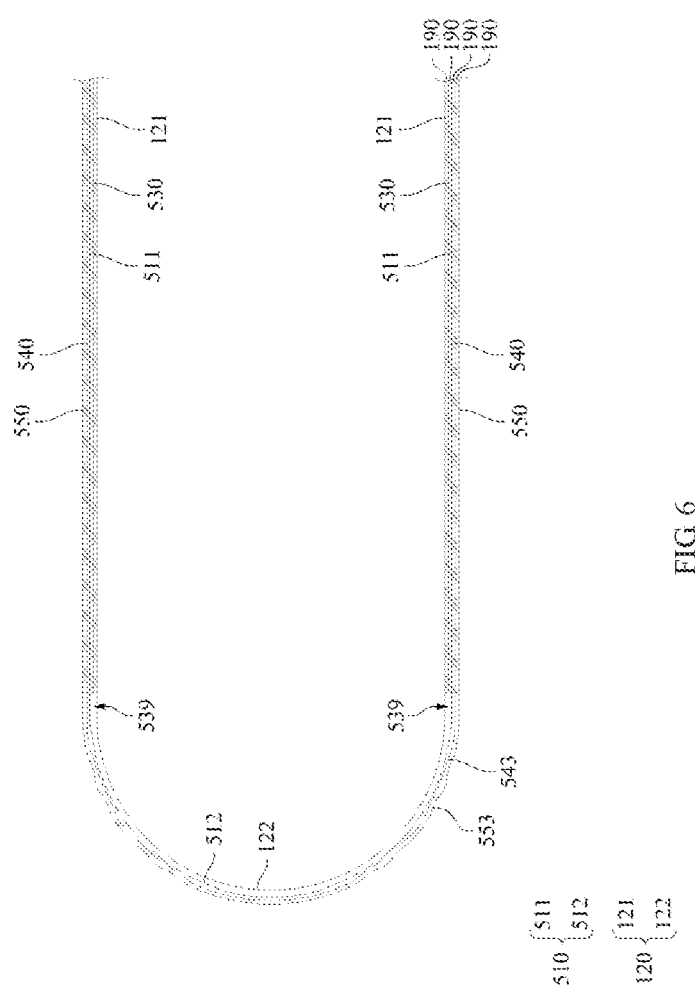
FIG. 6 is a side view of the heat transfer device in FIG. 5 at the bending state.

Please refer to FIG. 5 and FIG. 6, which is different from the embodiment shown in FIG. 1 and FIG. 2. In this embodiment, the first nonlinear section 513 facing the second heat conduction sheet 120 is recessed when the heat transfer device 500 is at the unfolded state. The heat transfer device 500 further includes a third heat conduction sheet 530. The third heat conduction sheet 530 is connected between the first heat conduction sheet 510 and the second heat conduction sheet 120. The third heat conduction sheet 530 includes the disconnection part 539. The disconnection part 539 is located between the first bendable part 512 and the second bendable part 122. The first nonlinear section 513 extends through the disconnection part 539.

The disconnection part 539 helps to increase the height of the single first nonlinear section 513. As a result, the single first nonlinear section 513 provides a longer lengthening value. Then, the stack structure of the multi-layer heat conduction sheet is easily configured.

As shown in FIG. 5 and FIG. 6, in an embodiment, the heat transfer device 500 further includes a fourth heat conduction sheet 540. The fourth heat conduction sheet 540 is located at a side of the first heat conduction sheet 510 away from the third heat conduction sheet 530. The fourth heat conduction sheet 540 is fixedly connected and thermally coupled to the two first rigid parts 511. The structure of the fourth heat conduction sheet 540 is similar to that of the first heat conduction sheet 510. However, the fourth heat conduction sheet 540 includes a plurality of fourth nonlinear sections 543 (such as the ladder structure). The number of the fourth nonlinear section 543 is greater than the number of the first nonlinear section 513. In the embodiment, each of the first nonlinear section 513 extends to form the recess 514 to accommodate two corresponding fourth nonlinear sections 543.

As shown in FIGS. 5 and 6, in an embodiment, the heat transfer device 500 further includes a fifth heat conduction sheet 550. The fifth heat conduction sheet 550 has a structure similar to the fourth heat conduction sheet 540. However, the fifth heat conduction sheets 550 includes a plurality of the fifth nonlinear sections 553 (such the ladder structure). The number of the fifth nonlinear section 553 is greater than that of the fourth nonlinear section 543. In the embodiment, each of the fourth nonlinear sections 543 is configured to accommodate two corresponding fifth nonlinear sections 553.

In summary, the heat transfer device in embodiments includes two heat conduction sheets stacked and fixedly connected to each other. A middle section of the two heat conduction sheets includes a bendable portion, respectively. The bendable portions of one of the heat conduction sheets include a nonlinear section. Thus, the bendable portion of this heat conduction sheet is longer than the bendable portion of another heat conduction sheet. Consequently, the heat transfer device of the above-mentioned structure has a good thermal conductivity and is easy to bend.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A heat transfer device, comprising:
 a first heat conduction sheet, including two first rigid parts and a first bendable part, and two ends of the first bendable part are respectively and directly connected to the two first rigid parts; and
 a second heat conduction sheet, including two second rigid parts and a second bendable part, and two ends of the second bendable part are respectively and directly connected to the two second rigid parts;
 wherein the two first rigid parts of the first heat conduction sheet are thermally coupled to the two second rigid parts of the second heat conduction sheet, respectively, and the first bendable part includes at least one first nonlinear section, such that the first bendable part is longer than the second bendable part, wherein the at least one first nonlinear section forms undulation when the heat transfer device is at an unfolded state, and the undulation of the at least one first nonlinear section disappears when the heat transfer device is at a folded state.

2. The heat transfer device according to claim 1, wherein the at least one first nonlinear section extends to form a recess, and the recess faces a direction away from the second heat conduction sheet.

3. The heat transfer device according to claim 2, wherein when the heat transfer device is at an unfolded state, the two first rigid parts are at a reference plane, and the at least one first nonlinear section is between the reference plane and the second heat conduction sheet.

4. The heat transfer device according to claim 2, further comprising:
a third heat conduction sheet, including two third rigid parts and a third bendable part, and the third bendable part is connected between the two third rigid parts;
wherein the first heat conduction sheet is between the second heat conduction sheet and the third heat conduction sheet, the two first rigid parts are thermally coupled to the two third rigid parts, the third bendable part includes at least one third nonlinear section, and the at least one third nonlinear section is in the recess.

5. The heat transfer device according to claim 4, wherein a number of the at least one third nonlinear section is greater than a number of the at least one first nonlinear section.

6. The heat transfer device according to claim 4, wherein the at least one first nonlinear section includes a first ladder structure, the at least one third nonlinear section includes a plurality of third ladder structures, a maximum width of the third ladder structure is smaller than the maximum width of the first ladder structure, and the third ladder structures is accommodated in the first ladder structure.

7. The heat transfer device according to claim 1, further comprising:
a third heat conduction sheet connected between the first heat conduction sheet and the second heat conduction sheet, the third heat conduction sheet further includes a disconnection part, the disconnection part is between the first bendable part and the second bendable part.

8. The heat transfer device according to claim 7, further comprising:
a fourth heat conduction sheet, located at a side of the first heat conduction sheet away from the third heat conduction sheet, the fourth heat conduction sheet is thermally coupled to the two first rigid parts, the fourth heat conduction sheet includes a plurality of fourth nonlinear sections, the at least one first nonlinear section extends to form a recess to accommodate the fourth nonlinear sections.

9. The heat transfer device according to claim 1, further comprising:
a thermal conductor fixedly connected between one of the two first rigid parts and one of the two second rigid parts.

10. The heat transfer device according to claim 1, wherein one of the two first rigid parts and one of the two second rigid parts soldered together.

11. A heat transfer device, comprising:
a first heat conduction sheet, including two first rigid parts and a first bendable part, the first bendable part is connected between the two first rigid parts; and
a second heat conduction sheet, including two second rigid parts and a second bendable part, the second bendable part is connected between the two second rigid parts,
a third heat conduction sheet connected between the first heat conduction sheet and the second heat conduction sheet, the third heat conduction sheet further includes a disconnection part, the disconnection part is between the first bendable part and the second bendable part,
wherein the two first rigid parts of the first heat conduction sheet are thermally coupled to the two second rigid parts of the second heat conduction sheet, respectively, and the first bendable part includes at least one first nonlinear section.

12. A heat transfer device, comprising:
a first heat conduction sheet, including two first rigid parts and a first bendable part, the first bendable part is connected between the two first rigid parts; and
a second heat conduction sheet, including two second rigid parts and a second bendable part, the second bendable part is connected between the two second rigid parts;
wherein the two first rigid parts of the first heat conduction sheet are thermally coupled to the two second rigid parts of the second heat conduction sheet, respectively, and the first bendable part includes at least one first nonlinear section, such that the first bendable part is longer than the second bendable part, wherein the at least one first nonlinear section is detached from a reference plane extended along the first heat conduction sheet, and wherein the at least one first nonlinear section includes a ladder structure in a shape of isosceles trapezoid, wherein the at least one first nonlinear section forms undulation when the heat transfer device is at an unfolded state, and the undulation of the at least one first nonlinear section disappears when the heat transfer device is at a folded state.

* * * * *